United States Patent
Kumano

(10) Patent No.: US 8,365,134 B2
(45) Date of Patent: Jan. 29, 2013

(54) CIRCUIT DESIGN ASSISTING APPARATUS, METHOD, AND PROGRAM

(75) Inventor: Yoshinori Kumano, Yokohama (JP)

(73) Assignee: Ricoh Company, Ltd., Tokyo (JP)

( * ) Notice: Subject to any disclaimer, the term of this patent is extended or adjusted under 35 U.S.C. 154(b) by 730 days.

(21) Appl. No.: 12/274,742

(22) Filed: Nov. 20, 2008

(65) Prior Publication Data

US 2009/0132986 A1  May 21, 2009

(30) Foreign Application Priority Data

Nov. 20, 2007 (JP) ................................ 2007-300367

(51) Int. Cl.
  *G06F 15/04* (2006.01)
  *G06F 17/50* (2006.01)
(52) U.S. Cl. ........................................................ 716/139
(58) Field of Classification Search .................... 716/139
  See application file for complete search history.

(56) References Cited

U.S. PATENT DOCUMENTS

| | | | | |
|---|---|---|---|---|
| 6,499,125 B1* | 12/2002 | Ohta et al. | ...................... | 714/734 |
| 6,564,367 B1* | 5/2003 | Tada et al. | ...................... | 716/117 |
| 7,451,424 B1* | 11/2008 | Reynolds et al. | ............ | 716/138 |
| 7,451,425 B1* | 11/2008 | Reynolds et al. | ............ | 716/138 |
| 2002/0149730 A1 | 10/2002 | Jeong et al. | | |
| 2003/0177455 A1* | 9/2003 | Kaufman et al. | ................. | 716/2 |
| 2005/0071787 A1* | 3/2005 | Koga et al. | ........................ | 716/1 |
| 2006/0117283 A1* | 6/2006 | Katou et al. | ...................... | 716/5 |
| 2006/0236284 A1* | 10/2006 | Kawahara | ........................ | 716/10 |
| 2007/0300196 A1* | 12/2007 | Ishibashi et al. | .................. | 716/6 |
| 2008/0086711 A1* | 4/2008 | Ito | .................................... | 716/12 |
| 2008/0141209 A1* | 6/2008 | Kashiwakura | .................. | 716/15 |
| 2008/0313585 A1* | 12/2008 | Otsuka | ............................. | 716/5 |
| 2009/0199143 A1* | 8/2009 | Schlotman et al. | ............... | 716/6 |
| 2009/0217231 A1* | 8/2009 | Ban | ................................. | 716/18 |
| 2009/0319972 A1* | 12/2009 | Onodera | ........................... | 716/6 |

FOREIGN PATENT DOCUMENTS

| | | |
|---|---|---|
| JP | 04-015874 A | 1/1992 |
| JP | 05-160374 A | 6/1993 |
| JP | 2002-149730 A | 5/2002 |
| JP | 2002-313920 A | 10/2002 |
| JP | 3616212 | 11/2004 |

* cited by examiner

*Primary Examiner* — Suresh Memula
(74) *Attorney, Agent, or Firm* — Dickstein Shapiro LLP

(57) ABSTRACT

A circuit design assisting apparatus for assisting a layout tool in designing an integrated circuit that includes a circuit module having plural cells achieving a prescribed function. A cell connection information acquiring device is provided to acquire cell connection information that specifies connection counterparts to the plural cells and is used when auto layout is executed by the layout tool. A terminal designating device is provided to designate a terminal of the circuit module. A terminal connection information generation device is provided to generate terminal connection information that specifies connecting counterparts to the terminal. A buffer circuit addition determining device is provided to determine one of if a buffer circuit is additionally connected between the terminal and the counterpart and if the buffer circuit already connected to the terminal is replaced in accordance with the terminal connection information.

10 Claims, 13 Drawing Sheets

FIG. 4

A : ( def-pin A0 type output )
B : ( def-pin DI0 type output )
C : ( def-pin DI4 type output )
D : ( def-pin CK type output )
E : ( def-pin DO0 type input )
F : ( def-pin DO2 type input )
G : ( def-pin DO3 type input )
H : ( def-pin DO4 type input )
I : ( def-comp or-X1 U376 )
J : ( def-comp buf-X1 U377 )
K : ( def-comp buf-X20 U378 )
L : ( def-comp buf-X20 U379 )
M : ( def-comp buf-X1 U380 )
N : ( def-comp or-X1 U381 )
O : ( def-comp buf-X20 U382 )
P : ( def-comp buf-X1 U383 )
Q : ( def-comp buf-X1 U384 )
R : ( def-comp buf-X1 U385 )
S : ( def-net A0 U376.out )
T : ( def-net DI0 U377.out )
U : ( def-net DI4 U378.out )
V : ( def-net CK U379.out U380.in )

| TERMINAL | in/out | INPUT REQUIREMENT | | OUTPUT REQUIREMENT | |
|---|---|---|---|---|---|
| | | MAX TRANSITION | UNIT | MAX CAPACITANCE | UNIT |
| A0 | out | 0.5 | ps | | |
| DI0 | out | 0.5 | ps | | |
| DI4 | out | 0.5 | ps | | |
| CK | out | 0.5 | ps | | |
| DO0 | in | | | 0.15 | pF |
| DO2 | in | | | 0.15 | pF |
| DO3 | in | | | 0.15 | pF |
| DO4 | in | | | 0.15 | pF |

⋮

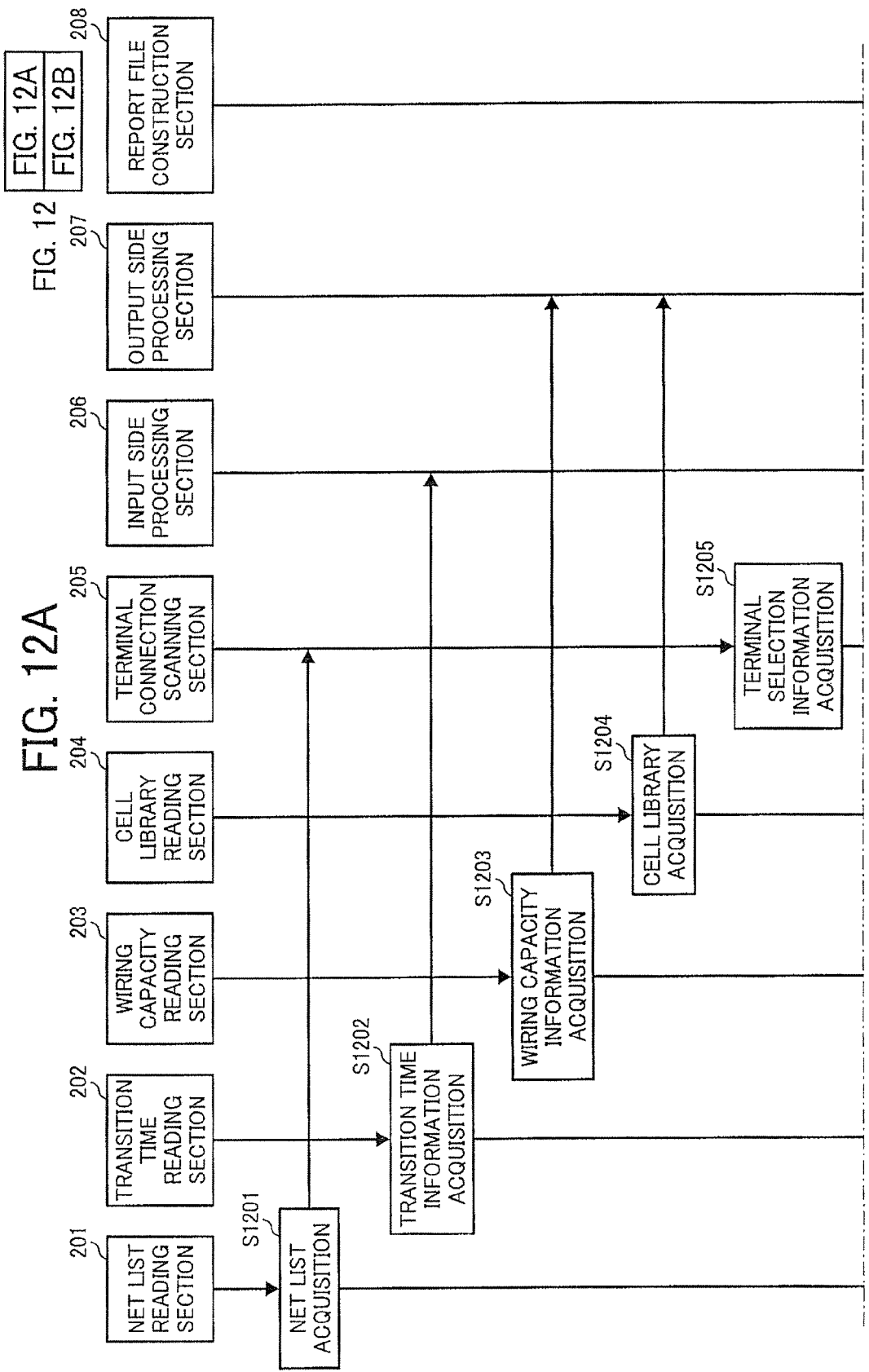

FIG. 13

| TERMINAL | TRANSITION | UNIT | |
|---|---|---|---|
| A0 | 0.315 | ps | |
| DI0 | 0.254 | ps | ... |
| DI4 | 0.288 | ps | |
| CK | 0.226 | ps | |

FIG. 14

| WIRING | CAPACITANCE | UNIT | |
|---|---|---|---|
| DO0 U389 | 0.003 | pF | |
| DO2 U390 | 0.004 | pF | ... |
| DO3 U383 | 0.005 | pF | |
| DO4 U391 | 0.010 | pF | |

FIG. 15

| CELL | INPUT GATE CAPACITANCE | UNIT | |
|---|---|---|---|
| U389 | 0.009 | pF | |
| U390 | 0.017 | pF | ... |
| U383 | 0.044 | pF | |
| U391 | 0.044 | pF | |

FIG. 16

| TERMINAL | in/out | CONNECTION DESTINATION CELL | INPUT REQUIREMENT | | | OUTPUT REQUIREMENT | | | DETERMINATION |
|---|---|---|---|---|---|---|---|---|---|
| | | | ABILITY VALUE | REQUIREMENT VALUE | UNIT | ABILITY VALUE | REQUIREMENT VALUE | UNIT | |
| A0 | out | U386 | 0.315 | 0.5 | ps | | | | ○ |
| DI0 | out | U387 | 0.254 | 0.5 | ps | | | | ○ |
| DI4 | out | U378 | 0.288 | 0.5 | ps | | | | ○ |
| CK | out | U388 | 0.226 | 0.5 | ps | | | | ○ |
| DO0 | in | U389 | | | | 0.012 | 0.15 | pF | ○ |
| DO2 | in | U390 | | | | 0.021 | 0.15 | pF | ○ |
| DO3 | in | U383 | | | | 0.049 | 0.15 | pF | ○ |
| DO4 | in | U391 | | | | 0.054 | 0.15 | pF | ○ |
| ... | | | | | | | | | |

CIRCUIT DESIGN ASSISTING APPARATUS, METHOD, AND PROGRAM

CROSS REFERENCE TO RELATED APPLICATION

This application claims priority under 35 USC §119 to Japanese Patent Application No. 2007-300367, filed on Nov. 20, 2007, the entire contents of which are herein incorporated by reference.

BACKGROUND OF THE INVENTION

1. Field of the Invention

The present invention relates to a circuit design assisting apparatus, a circuit design assisting method, and circuit design assisting program, and in particular to circuit designing capable of satisfying a signal requirement in an integrated circuit.

2. Discussion of the Background Art

When a semiconductor integrated circuit, especially a chip, mounting a hard macro, such as a RAM, a ROM, a CPU, a PHY, etc., is designed, the hard macro is needed to operate as specified. Because, it is common to design a semiconductor integrated circuit using an existing hard macro.

As a specific consideration factor in designing the semiconductor integrated circuit, a signal having a shorter transition time period than that supposed by a specification needs to be input to an input terminal of a hard macro. Further, a circuit (cell) having a smaller load capacity than that supposed by a specification needs to be connected to an output terminal of a hard macro. Thus, a conventional circuit design-assisting tool describes a design requirement, such as a maximum transition time permissible for an input terminal, a maximum load capacity driven by an output signal of the output terminal, etc., as specification information of the hard macro. Then, designing is executed meeting the requirement.

As a circuit design-assisting tool, the following has been proposed. For example, a length of wiring of scan chain data is calculated based on a net list and layout data outputted based on a weighting coefficient of wiring. The weighting coefficient is then changed in accordance with the calculation result. The Japanese Patent Application Laid Open No. 2006-323638 attempts to reduce scan chain wiring differently.

However, even the above-mentioned circuit design assisting tool is utilized, all of applicable devices does not satisfy the requirement. For example, when plural RAMs are arranged side by side, a length of wiring that connects terminals of the RAMs of the same voltage becomes longer due to a restriction on a cell arrangement space, and accordingly, the requirement cannot be satisfied. To solve such a problem, a buffer cell having an appropriate driving performance is connected to a terminal, which possibly raises such a problem, before a layout is executed by a circuit design assisting tool. Specifically, the layout is executed while positioning the buffer cell in the vicinity of the terminal of the hard macro raising the problem as closer as possible.

As a result, an operator needs to manually create a net list by inserting the buffer cell. A correspondence list listing a correspondence between terminals of the hard macro and buffer cells forcibly arranged in the vicinity of the terminals also needs to be manually created. Accordingly, when a number of hard macro or that of terminals increases, labor of the above-mentioned operation significantly takes a long time. In addition, an erroneous operation highly probably occurs. Further, confirmation of operation result needs a long time.

SUMMARY OF THE INVENTION

The present invention has been made in view of the above noted and another problems and one object of the present invention is to provide a new and noble circuit design assisting apparatus for assisting a layout tool in designing an integrated circuit. Such a new and noble circuit design assisting apparatus includes a circuit module having plural cells that achieve a prescribed function, a cell connection information acquiring device that acquires cell connection information that specifies connection counterparts to the plural cells and is used when auto layout is executed by the layout tool, and a terminal designating device that designates a terminal of the circuit module. A terminal connection information generation device is provided to generate terminal connection information that specifies connecting counterparts to the terminals. A buffer circuit addition determining device is provided to determine one of if a buffer circuit is additionally connected between the terminal and the counterpart and if the buffer circuit already connected to the terminal is replaced in accordance with the terminal connection information.

In another embodiment, a requirement acquiring device is provided to acquire a requirement to be met by a signal either inputted to or outputted from the terminal designated by the terminal designation device.

In yet another embodiment, an operation device is provided to receive an input from an operator and designate the terminal in accordance with the input.

In yet another embodiment, the terminal designation device designates the terminal in accordance with the terminal connection information.

In yet another embodiment, a requirement information acquiring device is provided to acquire a requirement to be met by a signal either inputted to or outputted from the terminal. A circuit chart display device is provided to display a circuit chart in accordance with the terminal connection information linking with the requirement.

In yet another embodiment, a wiring length requirement information generating device is provided to generate wiring length requirement to be met by a wiring that connects one of the buffer and the terminal.

In yet another embodiment, a cell connection information restructuring device is provided to restructure the cell connection information reflecting the determination of the addition or the replacement of the buffer.

In yet another embodiment, the circuit design assisting apparatus includes a restructured cell connection information acquiring device that acquires restructured cell connection information, a layout information acquiring device that acquires information of a layout executed in accordance with the restructured cell connection information, and a requirement information acquiring device that acquires the requirement to be met by a signal either inputted to or outputted from the terminal. A signal intensity information acquiring device is provided to acquire an intensity of a signal either inputted to of outputted from the terminal in accordance with the layout information, and a requirement determining device that determines and outputs a signal if the signal intensity meets the requirement by comparing the requirement information with the signal intensity.

In yet another embodiment, the signal intensity information acquiring device acquires a transition time of the signal inputted to the terminal. The requirement information acquiring device also acquires reference information to compare it with the transition time.

In yet another embodiment, the signal intensity information acquiring device acquires an electrostatic capacity to be driven by the signal outputted from the terminal of the circuit module. The requirement information acquiring device also acquires reference information to compare it with the electrostatic capacity.

BRIEF DESCRIPTION OF DRAWINGS

A more complete appreciation of the present invention and many of the attendant advantages thereof will be readily obtained as the same becomes better understood by reference to the following detailed description when considered in connection with the accompanying drawings, wherein:

FIG. 4 partially illustrates exemplary net list information according to one embodiment of the present invention;

FIG. 5 illustrates an exemplary requirement according to one embodiment of the present invention;

FIG. 13 illustrates exemplary transition time information according to one embodiment of the present invention;

FIG. 14 illustrates exemplary wiring capacity information according to one embodiment of the present invention;

FIG. 15 illustrates exemplary library information according to one embodiment of the present invention; and FIG. 16 illustrates exemplary information included in a report file according to one embodiment of the present invention.

DESCRIPTION OF THE PREFERRED EMBODIMENTS

Figure 1:
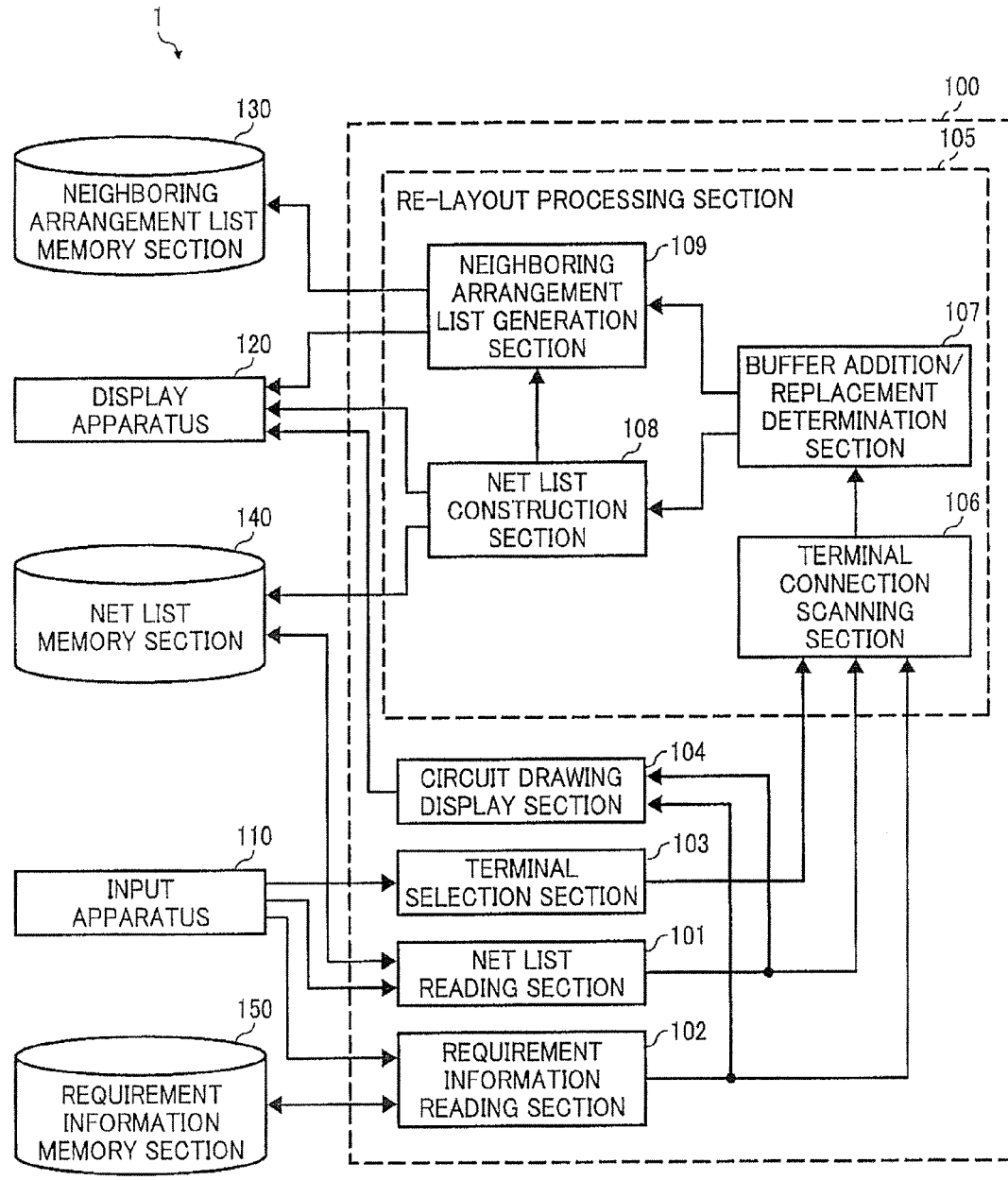
FIG. 1 is a block chart illustrating an exemplary circuit design assisting apparatus according to one embodiment of the present invention.

Referring now to the drawings, wherein like reference numerals and marks designate identical or corresponding parts throughout several figures, in particular in FIG. 1, a first embodiment is described. As mentioned later in detail, a circuit design assisting apparatus of this embodiment executes re-layout of integrated circuits based on a net list, which specifies connecting conditions in the integrated circuits, and information of a requirement to be met by a signal either inputted or outputted to and from a terminal in the integrated circuit, while newly connecting a buffer to an applicable terminal or changing a type of a buffer based on the net list.

Further, the circuit design assisting apparatus generates information as an instruction that a buffer is inserted or replaced as a result of the re-layout in the vicinity of a terminal. The circuit design assisting apparatus is constituted by a private use hardware installed in an operation terminal, such as a personal computer, etc.

Specifically, as shown in FIG. 1, the circuit design assisting apparatus 1 includes a controller 100, an input device 110, a display device 120, adjacent arrangement list storage 130, net list storage 140, and requirement storage 150. The controller 100 includes a net list reading device 101, a requirement reading device 102, a terminal designation device 103, a circuit chart display device 104, and a re-layout processing device 105. The re-layout processing device 105 includes a terminal connection scanning device 106, a buffer addition/replacement determination device 107, a net list construction device 108, and an adjacent arrangement list generation device 109.

The input device 110 serves as a user interface to receive an operator input to the circuit design assisting apparatus 1 and includes a keyboard or a mouse or the like. The display device 120 also serves as a user interface for a client device 1 to visually display information and includes a display monitor or the like. The adjacent arrangement list storage 130, the net list storage 140, and the requirement storage 150 store an adjacent arrangement list, a net list, and requirement, respectively, and each includes a non-volatile memory. Information stored in each of the storage is mentioned later in detail.

The controller 100 includes software and hardware. Specifically, control program, such as firmware, etc., stored in an on-volatile memory of a ROM, a HDD, or an optical disk or the like is loaded on a volatile memory, such as a DRAM, etc., and a software control device controlled by the CPU and a hardware, such as an integrated circuit, etc., are included in the controller 100. The controller 100 also serves as a general control device for generally controlling the circuit design assisting apparatus 1.

The net list reading device 101 acquires a net list as a re-layout objective for the circuit design assisting apparatus 1. The net list reading device 101 acquires information of the net list from either an operator through the input device 110 or from the net list storage 140. Specifically, the net list acquiring device 101 then inputs the net list to a circuit chart display device 104 and a re-layout processing device 105.

The requirement reading device 102 acquires information representing requirement to be met by an input/output signal to and from each of terminals included in the net list. The requirement to be met is referred to when the circuit design assisting apparatus 1 executes re-layout of the net list. Specifically, the net list reading device 102 acquires the requirement from either an operator through the input device 110 or the requirement storage 150. The net list reading device 102 then inputs the requirement to the circuit chart display device 104 and the re-layout processing device 105.

The terminal designation device 103 designates a terminal to be determined if a buffer is connected thereto or replaced when the circuit design assisting apparatus 1 executes re-layout in accordance with the requirement. Specifically, the terminal designation device 103 designates the terminal in accordance with information inputted by an operator via the input device 110. Thus, the terminal designation device 103 inputs information of the designated terminal to the re-layout processing device 105. The circuit chart display device 104 generates circuit chart information based on the net list read by the net list reading device 101 and the requirement read by the requirement reading device 102, while assigning the requirement to each of the terminals. The circuit chart information is then displayed on the display device 120.

The re-layout processing device 105 executes re-layout of the net list based on the information inputted from the net list reading device 101, the requirement reading device 102, and the terminal designation device 103. There-layout processing device 105 also generates an adjacent arrangement list, which represents that a buffer either connected or replaced in the re-layout of the net list needs to be arranged in the vicinity of an applicable terminal as much as possible. As shown in FIG. 1, various component devices cause the re-layout processing device 105 to perform respective functions.

The terminal connection scanning device 106 executes scanning of the net list inputted from the net list reading device 101, and analyzes a connecting condition with a terminal designated in terminal designation information inputted from the terminal designation device 103. The terminal connection scanning device 106 generates and inputs information representing the connecting condition with the designated terminal into the buffer addition/replacement determination device 107. The terminal connection scanning device 106 transfers the requirement inputted from the requirement reading device 102 to the buffer addition/replacement determination device 107.

The buffer addition/replacement determination device 107 calculates either a transition time of a signal inputted to each of the terminals and a capacity of a signal outputted therefrom to drive based on the connection scanning result information acquired from the terminal connection scanning device 106. The buffer addition/replacement determination device 107 determines necessity of addition and replacement of a buffer to meet the requirement based on the requirement and the calculation information. The net list construction device 108 changes an original net list acquired by the net list reading device 101 and reconstructs a new net list by reflecting the buffer addition and replacement determination result. Specifically, the net list construction device 108 executes re-layout. The net list construction device 108 stores the new net list in the net list storage device 140 and displays the same on the display device 120 as a result of the re-layout.

The adjacent arrangement list generation device 109 generates an adjacent arrangement list specifying that a buffer inserted or replaced is arranged in the vicinity of a target terminal based on the net list acquired after execution of the re-layout. The adjacent arrangement list generation device 109 then stores the adjacent arrangement list in the adjacent arrangement list storage device 130 and displays thereof on the display device 120.

Figure 2:
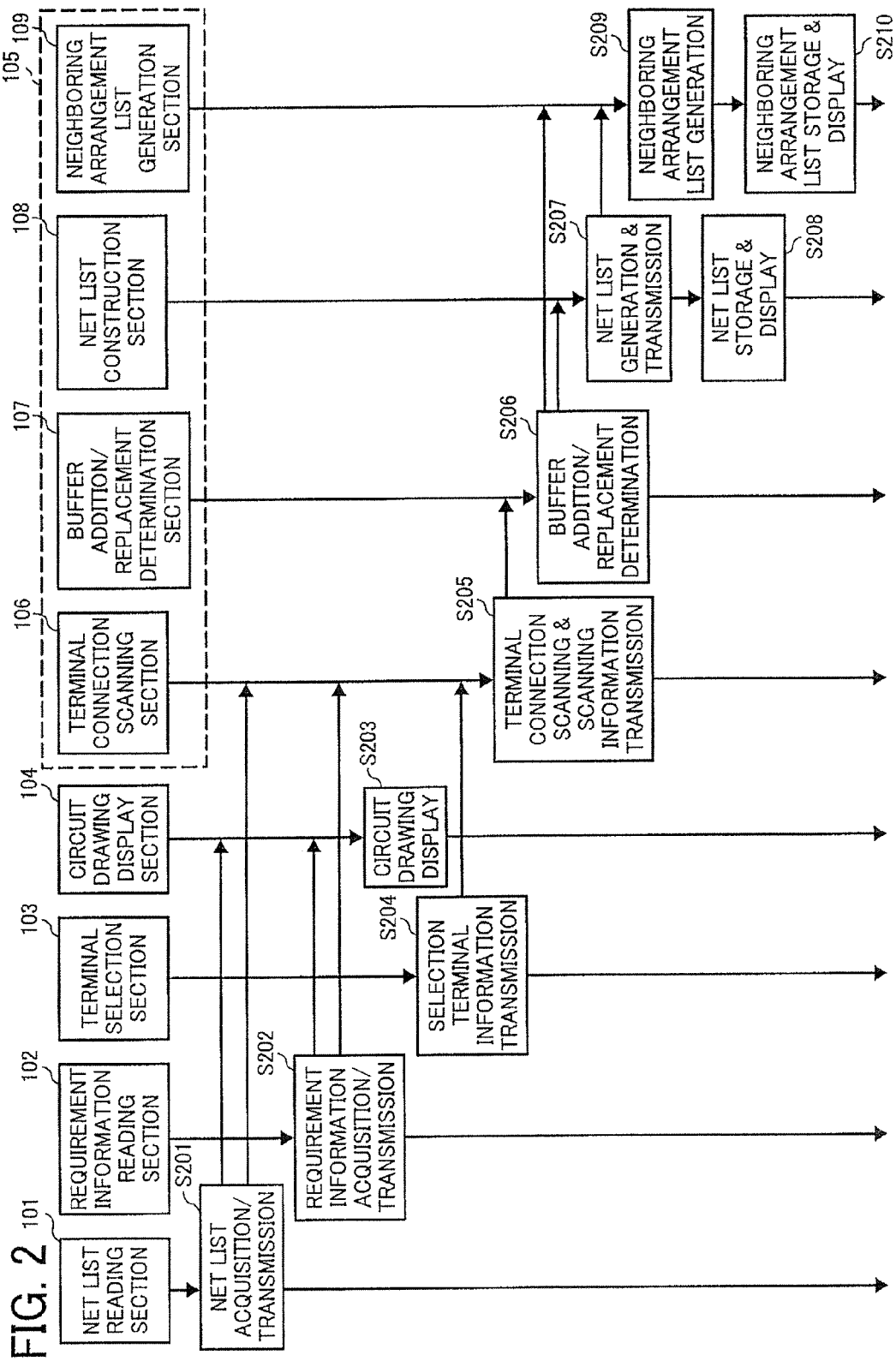
FIG. 2 is a time chart illustrating an exemplary sequence of operations of the circuit design assisting apparatus.
Figure 3:
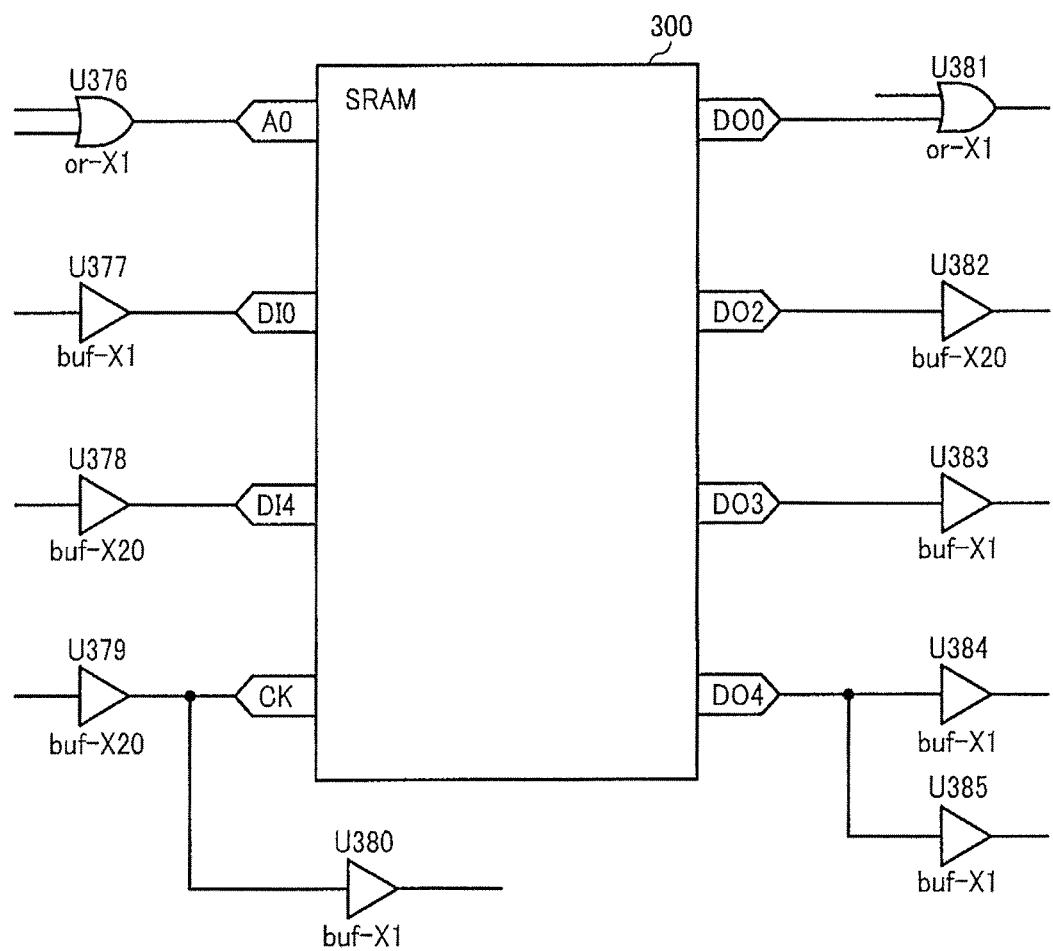
FIG. 3 partially illustrates an exemplary integrated circuit according to one embodiment of the present invention.

Now, with reference to FIG. 2, an exemplary operation of the circuit design assisting apparatus 1 according to one embodiment of the present invention is described. As shown, a net list specifying an integrated circuit is laid out again as shown in FIG. 3. FIG. 3 illustrates an exemplary integrated circuit including a SRAM 300 as a hard macro. The hard macro includes a circuit module having a set of cells so as to achieve a prescribed function as mentioned later in detail.

When a user operates the input device 110, the net list reading device 101 acquires a net list as a re-layout objective in step S201. The net list reading device 101 then transmits the net list to both of the circuit chart display device 104 and the terminal connection scanning device 106 in step S201. The user can directly input information of a net list by operating the input device 110. The net list reading device 101 can read a net list stored in the net list storage device 140.

Exemplary information of the net list according to an embodiment is illustrated in FIG. 4. As shown, the information of the net list is described using a language of NLD (Net List Description). For example, the description on line A in FIG. 4 defines a terminal A0 of FIG. 3. Similarly, the description "def-pin" defines a terminal, "A0" represents a discriminator of a terminal, and "type output" represents an output terminal. The terminal A0 serves as an input terminal of the SRAM 300. The terminal A0 also serves as an output terminal of a circuit of FIG. 3 to input a signal to the SRAM 300.

The description on line "I" defines an OR circuit U376 of FIG. 3. Similarly, the description "def-comp" defines a cell. The description "or-X1" is a discriminator representing general parts. The description "U376" represents a discriminator of a cell. Specifically, the description on line "I" represents that the parts already defined as "or-X1" is used as a cell assigned the description "U376". Description of "or-X1" represents an OR circuit, "buf-X1" represents a low drive buffer, and "buf-X20" represents a high drive buffer.

Further, the description on line "S" defines connection of the OR circuit U376 and the terminal A0. Specifically, the descriptor "def-net" defines connection, "A0" defines a connector, while U376.out" defines the other connector. Since the terminal A0 is an output terminal, only one connection device exists and is described as "A0" However, since the OR circuit U376 includes plural inputs and outputs, a portion to connect is described such as "U376.out". Specifically, the description on line "S" describes that the terminal A0 is connected to the output terminal of the OR circuit U376. Hence, the net list represents plural cells included in a main circuit and a connection condition of those. Accordingly, the net list reading device 101 functions as a connection information acquiring device.

Similar to the acquiring operation of the net list, when the user operates the input device 110, the requirement reading device 102 acquires a requirement in step S202. The requirement reading device 102 then transmits the requirement to both of the circuit chart display device 104 and the terminal connection scanning device 106 in step S202. The user can directly input the requirement by operating the input device 11. The requirement reading device 102 can read a net list stored in the requirement storage device 150.

An exemplary requirement according to one embodiment is now described with reference to FIG. 5. The requirement is to be met by an input/output signal to and from the SRAM 300 as a hard macro. As shown, a transition time period of a signal outputted to the terminal A0 (i.e., a signal inputted to the terminal of the SRAM 300 is limited to less than 0.5 (ps). Also, a capacity driven by a signal outputted from the terminal DO0 is specified as being less than 0.15 (pf). Specifically, the requirement is satisfied by an intensity of a signal inputted to or outputted from the input and output terminals of the hard macro.

Figure 6:
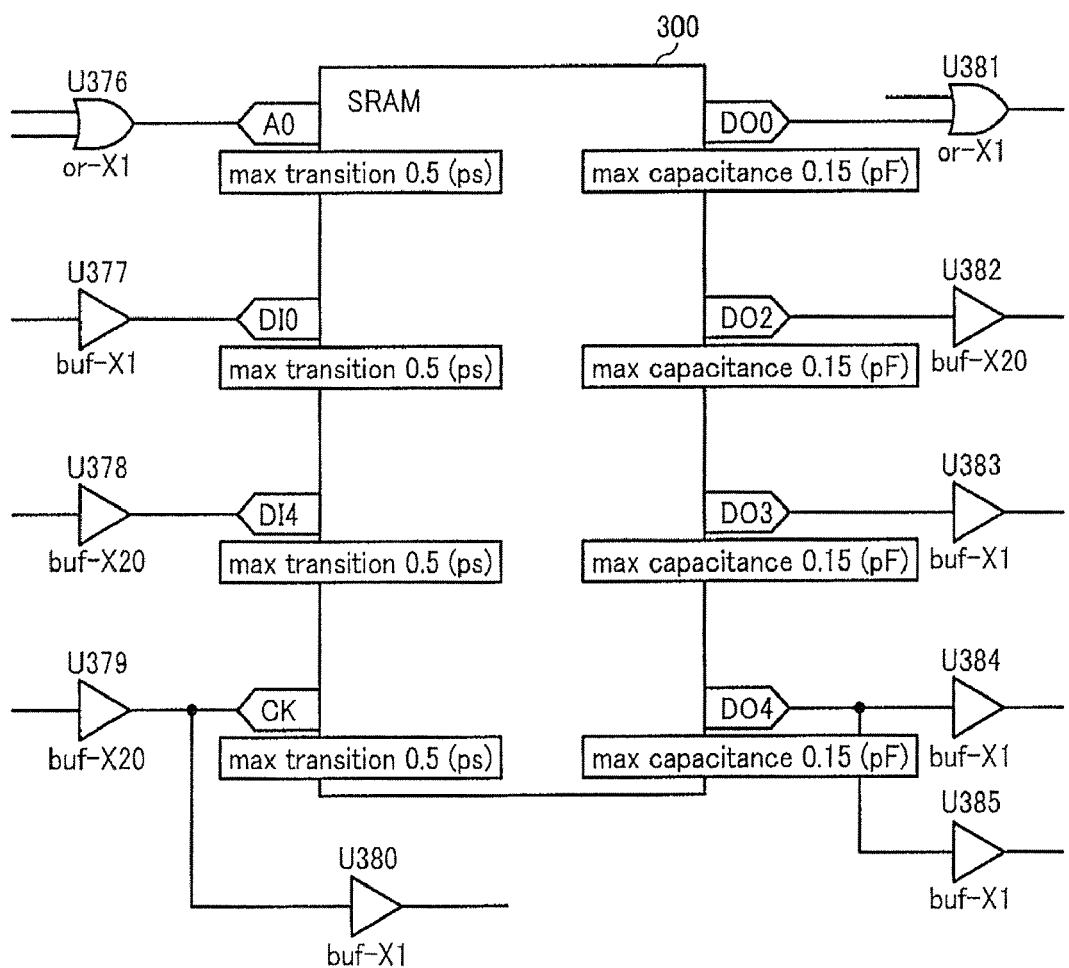
FIG. 6 partially illustrates another exemplary integrated circuit according to one embodiment of the present invention.

The circuit chart display device 104 generates and displays a circuit chart on the display device 120 together with a requirement assigned to a corresponding terminal upon receiving both of the net list information and the requirement from the net list reading device 101 and the requirement reading device 102, respectively, in step S203. FIG. 6 illustrates an exemplary circuit chart displayed on the display device 120 in step S203. As shown, the circuit chart includes the net list of FIG. 3 and the requirements to be met by a signal inputted or outputted to each of the terminals. Thus, since the requirement to be met by the signal is displayed in the vicinity of each of the terminals, an operator can readily understand a relation between terminals included in the integrated circuit and the signal requirement as to the terminals, so that the operator can readily designate a terminal as a re-layout objective.

Thus, when the circuit chart is displayed by the circuit chart display device 104, the operator operates the input device 110, and designates a terminal to be determined if a buffer is to be added thereto or is replaced. Specifically, the terminal designation device 103 transmits information of a designation terminal inputted from the input device 110 to the terminal connection scanning device 106 in step S204. Thus, the input device 110 and the terminal designation device 103 collectively function as a terminal designation device. Upon receiving the information of the net list, the requirement, and the designation terminal information from the net list reading device 101, the requirement reading device 102, and the terminal designation device 103, respectively, the terminal connection scanning device 106 analyzes the net list and inspects a connecting condition with the terminal designated in the designation terminal information in step S205.

For example, when the terminal A0 is designated, a line including the description "A0" is extracted among the descriptions of "def-net" as shown in FIG. 4. Specifically, the terminal connection scanning device 106 extracts the description on the line "S". Then, information of a cell described together with the terminal A0 in the description of "def-net" is extracted. The terminal connection scanning device 106 then recognizes the description "U376.out" on line "S", and extracts a description on line "I" describing "U376" among the descriptions of "def-comp" based on the recognition. Then, the terminal connection scanning device 106 recognizes that a parts defined as "or-X1" is used in the cell defined as U376" based on the descriptor of the line "I". Thus, the terminal connection scanning device 106 recognizes that the terminal A0 is connected to an output terminal of an OR circuit U376. The terminal connection scanning device 106 generates and inputs information of the cell connected to the designation terminal as scanning result information in the buffer addition/replacement determination device 107. Thus, the terminal connection scanning device 106 serves as a terminal connection information generation device for generating information representing connecting condition between the designated terminal and the cell connected thereto.

Figure 7:
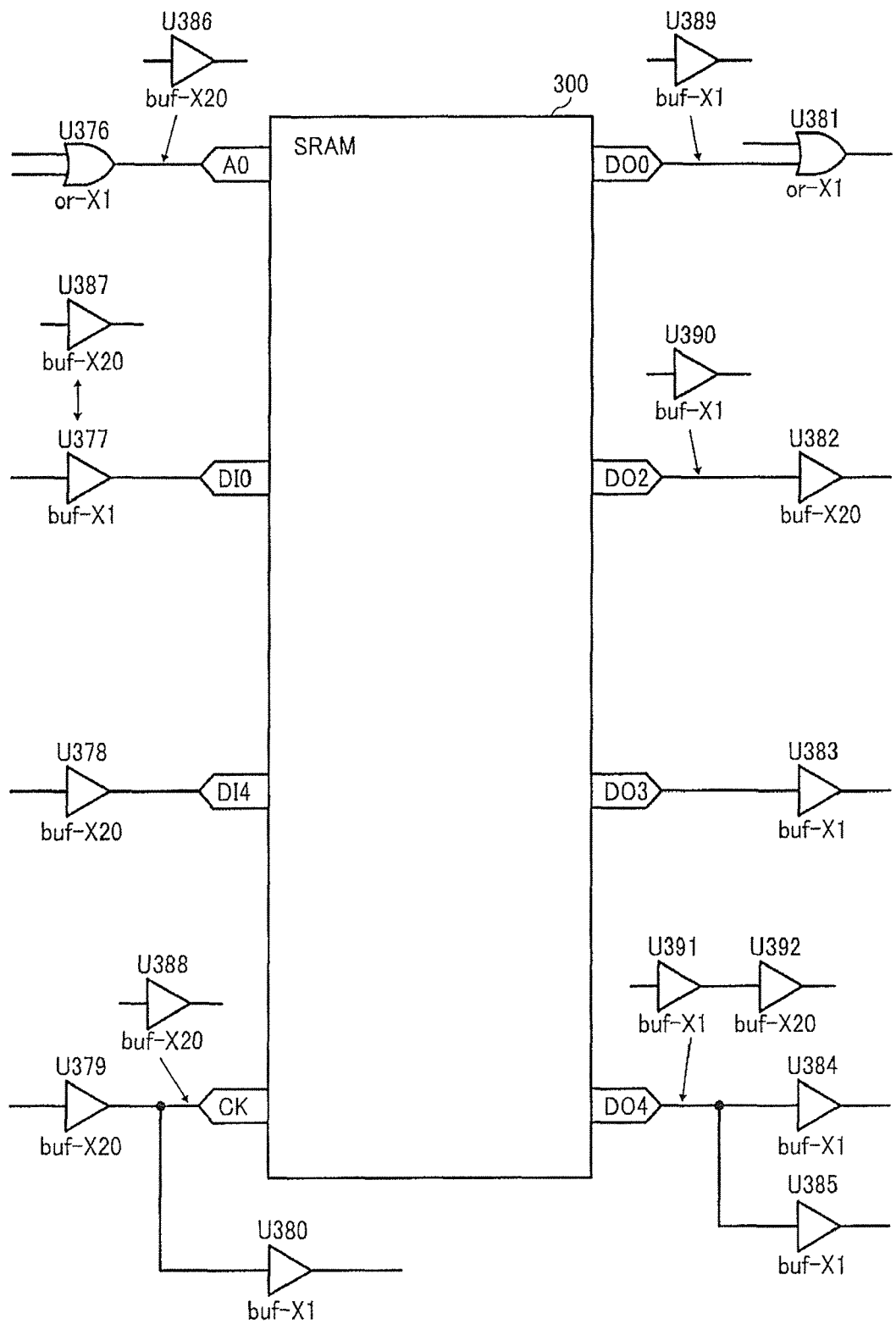
FIG. 7 illustrates an other exemplary requirement according to one embodiment of the present invention.

Upon receiving the scanning result information, the buffer addition/replacement determination device 107 determines if a buffer is to be added to the designation terminal or is replacement based on the scanning result information as described in FIG. 7. As described with reference to FIG. 3, a cell connected to the terminal A0 is the OR circuit U376. Thus, when lots of such multi input cells that drive an input are widely used and a layout is automatically executed, a connection with the cell should be considered. Because, a wiring length connecting the OR circuit U376 and the terminal A0 possibly becomes longer. In such a situation, if the OR circuit U376 is forcibly arranged in the vicinity of the terminal A0, a time of an input to the OR circuit U376 is possibly affected. Accordingly, the buffer addition/replacement determination device 107 determines addition of a high driving buffer U386 to a section between the OR circuit U376 and the terminal A0 as shown in FIG. 7.

Further, the cell connected to the terminal DI0 is an output from a low drive buffer U377 having a low drive performance. The low drive buffer possibly leaves a long transition time of an output signal unimproved due to its own performance when an input signal has a long transition time period. As a result, a signal requirement as to a terminal DI0 cannot be satisfied. Accordingly, the buffer addition/replacement determination device 107 determines replacement of the low drive buffer U377 with a high drive buffer U387 as shown in FIG. 7. Further, a cell connected to the terminal DI4 is an output of the high drive buffer U378. Accordingly, the buffer addition/replacement determination device 107 determines that addition or replacement of the buffer is not needed, because this situation is the same as that of the terminal DI0.

Further, a cell connected to the terminal CK is an output of the high drive buffer U379 and an input of the low drive buffer U380. Specifically, there are two fine outs of the high drive buffer U379. When there are many fine outs, a transition time period of an output signal possibly becomes longer even if the high drive buffer is connected. Then, the buffer addition/replacement determination device 107 determines addition of a high drive buffer U388 more in the vicinity of the terminal CK than a bifurcation to an input of the low drive buffer U380 in the wiring between the high drive buffer U379 and the terminal CK as shown in FIG. 7.

Further, a cell connected to the terminal DO0 is an input of the OR circuit U381. For the same reason as mentioned as to the terminal A0, it is not preferable to forcibly arrange the OR circuit U381 in the vicinity of the terminal DO0. Then, the buffer addition/replacement determination device 107 adds a low drive buffer U389 between an input of the OR circuit U381 and the terminal DO0 as shown in FIG. 7.

Further, a cell connected to the terminal DO2 is an input of a high drive buffer U382. Due to its own performance, a gate capacity of the input of the high drive buffer is large. As a result, a signal requirement as to the terminal DO2 is not satisfied, that is, a prescribed load capacity that the terminal DO2 can properly drive is possibly exceeded. Then, the buffer addition/replacement determination device 107 determines addition of a low drive buffer U390 between the terminal DO2 and an input of the high drive buffer U382 as shown in FIG. 7. Further, a cell connected to the terminal DO3 is an input of a low drive buffer U383. Since this situation is the same as where a buffer is added or replaced in relation to the terminal DO2, the buffer addition/replacement determination device 107 does not determine that addition or replacement of a buffer is needed.

Further, a cell connected to the terminal DO4 is inputs of low drive buffers U384 and U385. Even if cells connected to the terminal DO4 are low drive buffers, a load capacity increases in proportion to a number of cells. As a result, a signal requirement as to the terminal DO4 is not satisfied. That is, a prescribed load capacity that the terminal DO4 can properly drive is possibly exceeded. Then, a low drive buffer is added to a section before a bifurcation of the output wiring of the terminal DO4 to low drive buffers U384 and U385. However, since a number of fine outs increases in the added low drive buffer, a driving performance thereof possibly becomes insufficient. Accordingly, the buffer addition/replacement determination device 107 determines addition of low and high drive buffers U391 and U392 in this order before the bifurcation of the output wiring of the terminal D04 toward the low drive buffers U384 and U385.

According to this embodiment, the buffer addition/replacement determination device 107 determines insertion (or addition) or replacement of a low or a high drive buffer to buffer a signal transmitted between input and output terminals of a hard macro and cells connected thereto. Thus, a buffer circuit connected to the input and output terminals of a hard macro is designated. Thus, the buffer addition/replacement determination device 107 serves as a buffer circuit designating device.

The buffer addition/replacement determination device 107 then inputs information representing addition and replacement of the buffer in the net list construction device 108 and the adjacent arrangement list 109 in step S206. The net list construction device 108 generates and transmits a net list obtained by adding or replacing a buffer to the adjacent arrangement list generation device 109 upon receiving the buffer addition or replacement determination information from the buffer addition/replacement determination device 107 based on the information in step S207. In other words, the net list construction device 108 reconstructs a net list by reflecting the buffer added or replaced based on the buffer addition or replacement determination information. Thus, the net list construction device 108 serves as a connection information reconstruction device. Discriminator information, such as U386, U387, etc., of the high drive buffers added or replaced as described with reference to FIG. 7 is assigned when the net list construction device 108 reconstructs the net list.

Figures 8, 9:
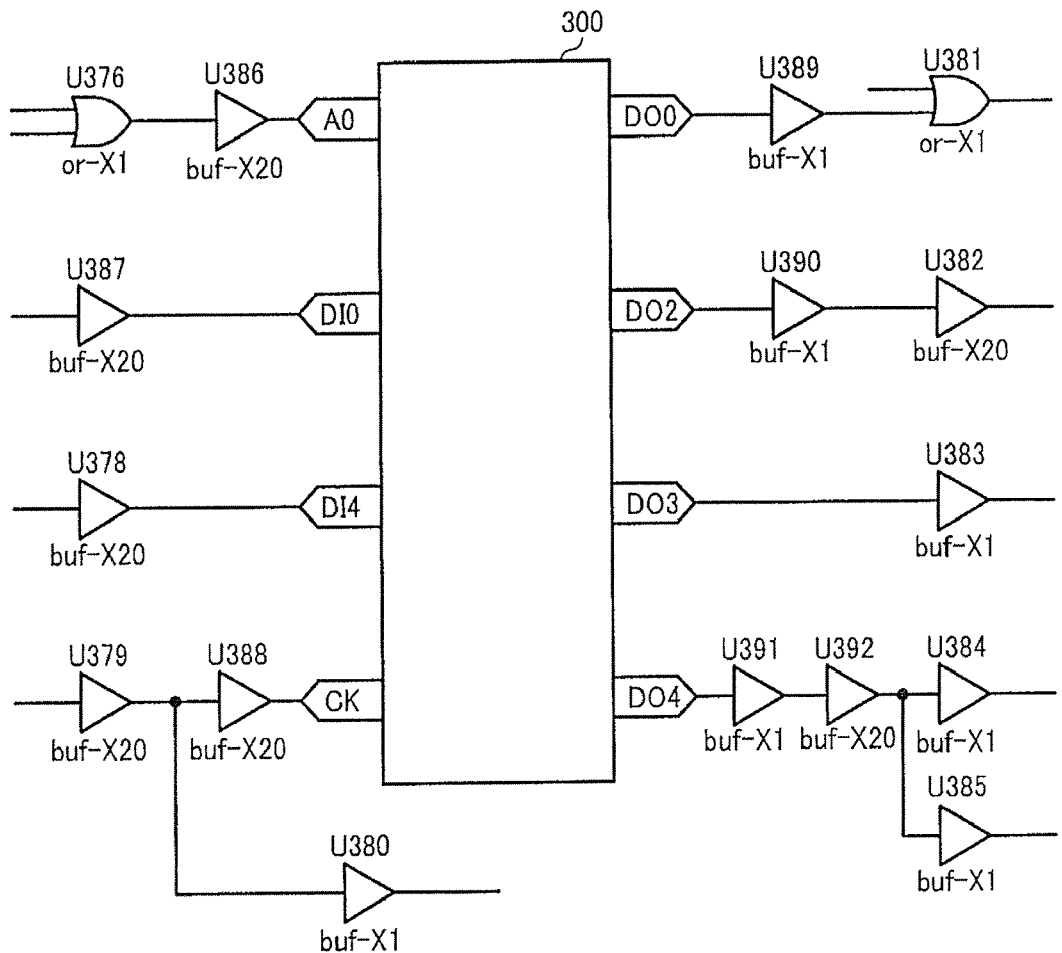
FIG. 8 illustrates yet another exemplary requirement according to one embodiment of the present invention.
FIG. 9 illustrates an exemplary adjacent arrangement list according to one embodiment of the present invention.

The net list construction device 108 stores the modified net list in the net list storage device 140 after transmitting the modified net list to the adjacent arrangement list reconstruction device 109. Further, the net list construction device 108 displays a circuit chart created based on the modified net list on the display device 120 in step S208. FIG. 8 illustrates an exemplary display of a net list modified in step S208.

Upon receiving the buffer addition/replacement determination information and the modified net list information from the buffer addition/replacement determination device 107 and the net list construction device 108, respectively, the adjacent arrangement list generation device 109 generates an adjacent arrangement list specifying that the added or replaced buffer is arranged in the vicinity of a target terminal in step S209.

The adjacent arrangement list generation device generates information representing that a length of a wiring connecting the buffer determined to be added or replaced to the target terminal is less than a prescribed level. Thus, the adjacent arrangement list generation device serves as a wiring length requirement generation device.

Exemplary information of the adjacent arrangement list generated in step S209 is illustrated in FIG. 9. As shown, a terminal of a SRAM 300 as a hard macro is described linking with a buffer connected in the vicinity of the terminal in the adjacent arrangement list. After generating the adjacent arrangement list in step S209, the adjacent arrangement list generation device 109 stores the adjacent arrangement list in the adjacent arrangement list storage device 130 and displays it on the display device 120 in step S210.

Thus, the net list is subjected to buffer addition and replacement so as to satisfy a signal requirement in relation to a designated terminal, thereby a modified net list is generated. Further, an adjacent arrangement list specifying a correspondence between the buffer added or replaced and the target terminal, signal requirement of which is relaxed by the buffer, is generated based on the net list created after the re-layout. By automatically executing arrangement and wiring of the cells using a layout tool based on the generated information, a layout is executed satisfying the signal requirement.

According to the circuit design assisting apparatus of this embodiment, addition or replacement of a buffer is determined in relation to a target terminal based on a connecting condition therewith and a signal requirement in relation to the target terminal among the terminals included in the integrated circuit. Then, a net list of a circuit created by adding or replacing a buffer is automatically generated, and correspondence information representing that an added or replaced buffer is arranged in the vicinity of a target terminal is generated. Thus, a layout design of an integrated circuit satisfying requirement as to a signal either inputted to or outputted from each section of the integrated circuit can be easier.

Further, since addition of a buffer to a target terminal or replacement thereof is automatically determined, a human error can be suppressed.

In the above, the terminal DI0 is described in a case where the low drive buffer U377 is replaced with the high drive buffer U387 with reference to FIG. 7. Thus, the requirement of the transition time period as to the terminal DI0 can be satisfied. However, depending on a driving performance of a signal inputted to the buffer U387, a precise operation sometimes cannot be expected. The high drive buffer U387 can simply be added between the low drive buffer U377 and the terminal DI0 without replacing the low drive buffer U377 with the high drive buffer U387. In such a situation, even though a number of cells increases, the input side of the low drive buffer U377 is not affected and the transition time period of the signal inputted to the terminal I0 can be improved.

Further, as mentioned with reference to FIG. 4, the NLD language is typically utilized to represent the net list in the above-mentioned description. However, the other type of information can be used as far as it can represent a connecting condition with the integrated circuit.

As mentioned above with reference to FIG. 6, the requirement information of an input/output signal is typically used to represent correspondence to the applicable terminal. However, the requirement information can also be used to designate a terminal to be determined if a buffer is either added or replaced. Specifically, although only the terminal designated by the operator through his or her operation of the input device1 110 is determined if the requirement is met and buffer insertion or replacement is determined in the above-mentioned description, only a terminal assigned the requirement as to the input or output signal can be designated. As a result, labor of designating a terminal to be determined if a buffer is added or replaced can be reduced for the operator.

To determine a terminal to be determined if a buffer is added or replaced, another apparatus can be employed. For example, the above-mentioned operation can be executed in all of input/output terminals of a hard macro included in a net list read by the net list reading device 101. Further, cells are not always connected to all of terminals of the hard macro. In such a situation, the terminal connection scanning device 106 can refer to the net list, and specifies a terminal connected to the cell among the terminals of the hard macro.

Figure 10:
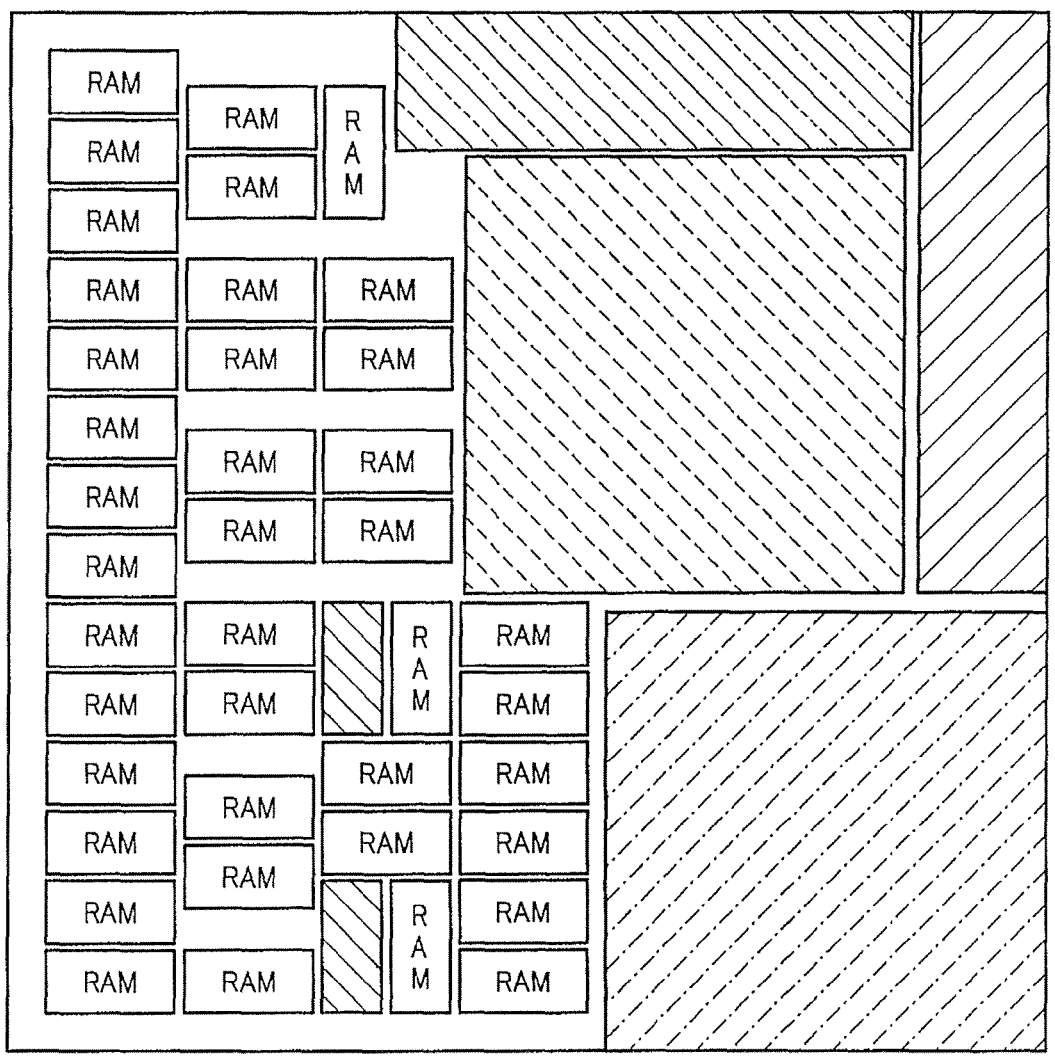
FIG. 10 illustrates an exemplary result of layout executed by a layout tool according to another embodiment of the present invention.

Now, a second embodiment is described with reference to FIG. 10. As mentioned earlier, in the first embodiment, the net list is typically analyzed and the buffer addition/replacement is then determined based on the requirement as to the terminal before executing the automatic layout by means of the layout tool. According to the second embodiment, another exemplary circuit design assisting apparatus is provided to confirm if an input/output signal to and from each of terminals of a hard macro included in an integrated circuit satisfies a requirement after the layout is executed by the layout tool according to the first embodiment as described with reference to FIG. 10.

Specifically, the layout tool determines cell arrangement and a manner of wiring the cells based on the net list as shown there. Thus, owing to the determination of the wiring between the cells, a transition time period for an input terminal to each hard macro can be calculated and information thereof is generated as a result of the layout. Further, a capacity of the wiring connected to an output terminal from each of the macro can be calculated by the same reason and information thereof can be generated. The information of the transition time period and wiring capacity are stored as layout information. Detail of information included in the layout information is mentioned later in detail.

Figure 11:
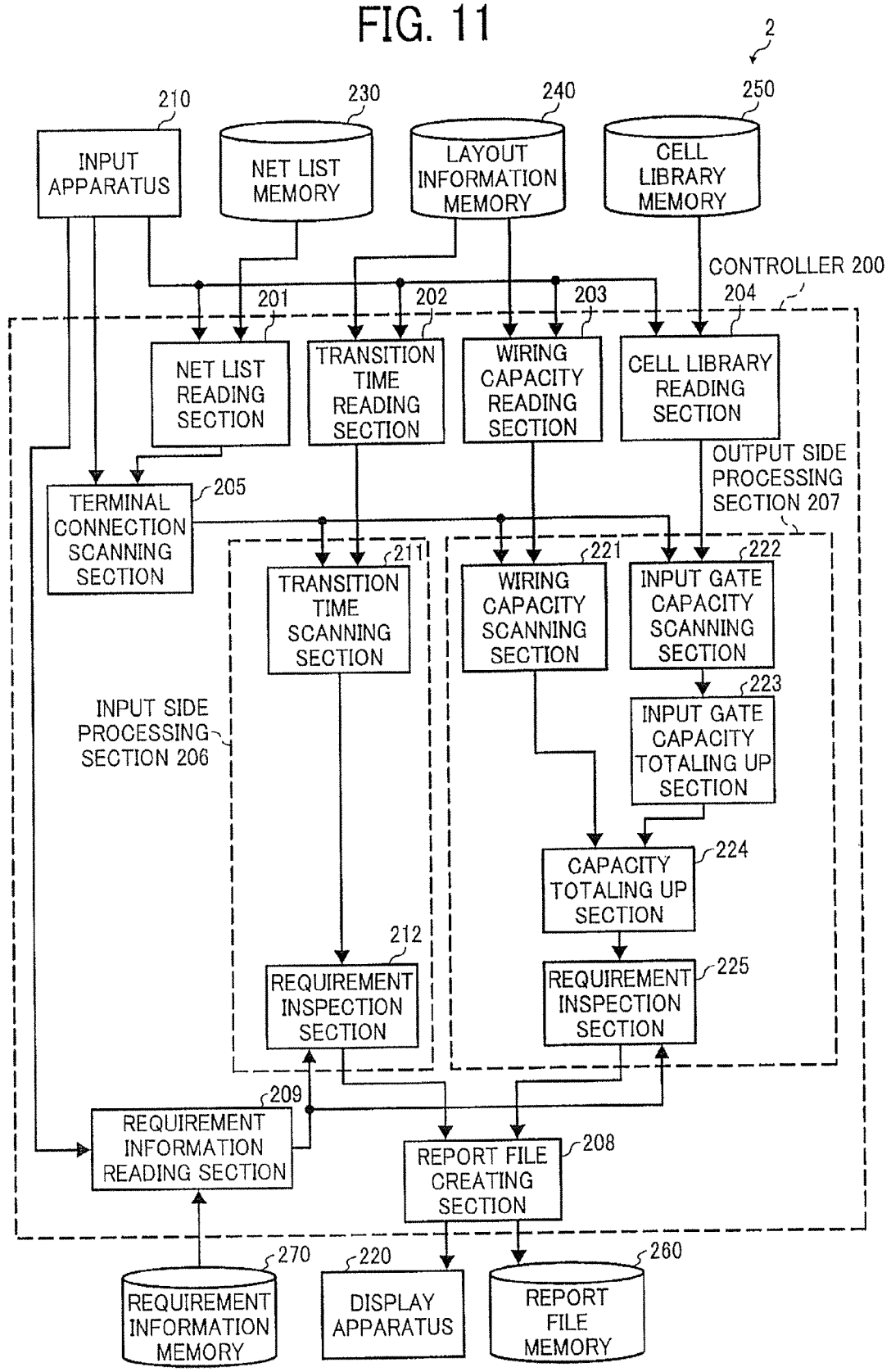
FIG. 11 is a time chart illustrating an exemplary sequence of operations of another circuit design assisting apparatus.

Similar to the first embodiment, the circuit design assisting apparatus 2 is constituted by installing a private use hard ware or software program in an information processing terminal such as a personal computer as shown in FIG. 11. Further, the circuit design assisting apparatus 2 includes a controller 200, an input/output device 210, a display device 220, a net list storage device 230, a layout information storage device 240, a cell library storage device 250, a report file storage device 260, and a requirement storage device 270.

The controller 200 includes a net list reading device 201, a transition time period reading device 202, and a wiring capacity reading device 203. Also included are a cell library 204, a terminal connection scanning device 205, an input side processing device 206, and an output side processing device 207. Further included are a report file construction device 208, and a requirement reading device 209.

Further, the input side processing device 206 includes a transition time period scanning device 211 and a requirement inspection device 212. The output side processing device 207 includes a capacity totaling device 224 and a requirement inspection device 225.

The input device 210, the display device 210, the net list storage device 230, and the requirement storage device 270 have the same configurations and functions as the input device 110, the display device 110, the net list storage device 130, and the requirement storage device 150, respectively. The layout information storage device 240, the cell library storage device 250, and the report file storage device 260 store layout information, cell library information, and report file information, respectively, each including a non-volatile memory medium such as a HDD, an EEPROM, etc. Information stored in each storage is mentioned later in detail.

Similar to the controller 100, the controller 200 includes software and a hard ware and serves as a control device for generally controlling the circuit design assisting apparatus 2. The net list reading device 201 acquires a net list of a circuit, a layout result of which is inspected by the circuit design assisting apparatus 2, from the net list storage device 230 by reading information therefrom when an operator operates the input device 210. The transition time period reading device 202 acquires information representing a transition time period for an output terminal in an integrated circuit (i.e., a input terminal to a hard macro) from the layout information stored in the layout information storage device 240 when an operator operates the input device 210. The wiring capacity reading device 203 acquires information representing an electrostatic capacity of wiring connecting cells from the layout information stored in the layout information storage device 240 when an operator operates the input device 210.

The cell library reading device 204 acquires cell library information stored in the cell library storage device 250 when an operator operates the input device 210. The terminal connection scanning device 205 is included in an integrated circuit to inspect a layout result. The terminal connection scanning device 205 extracts information related to connecting condition with a cell connected to a terminal of a hard macro designated by an operator via the input device 210 based on analysis of the net list, which is read by the net list reading device 201.

The input side processing device 206 acquires a transition time period of a signal inputted to the hard macro based on information of a layout result. Then, the transition time period is compared with requirement to be met by the transition time period in relation to each terminal to inspect if the requirement is satisfied. The output side processing device 207 calculates a capacity to be driven by a signal outputted from the hard macro also based on the information of the layout result. Then, the capacity is compared with a requirement to be met by a capacity driven by a signal from each terminal to inspect if the requirement is satisfied. Each section inside the input and output side processing devices 207 and 208 is described later is detail.

The report file construction device 208 generates report file information representing a result of inspection based on both of the information of the result obtained by the input side processing device 206 and the output side processing device 207. The report file construction device 209 then outputs the report file information to the display device 220 and the report file storage device 260. The requirement reading device 209 acquires a requirement for each terminal included in a circuit, a layout result of which is inspected by the circuit design assisting apparatus 2, from the requirement storage device 270 when an operator operates the input device 210.

Figure 12B:
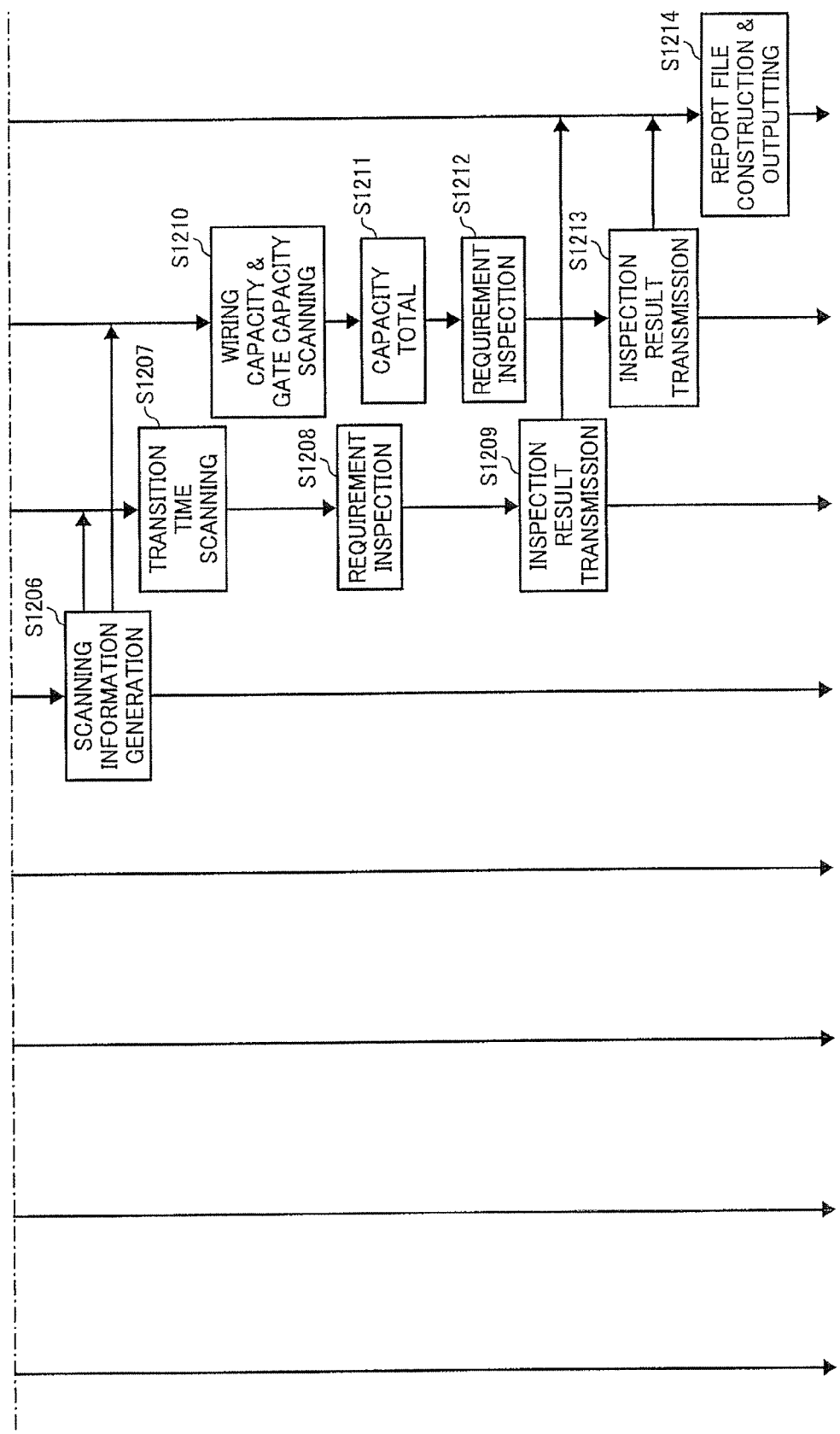
FIG. 12 is a time chart illustrating an exemplary sequence of operations of yet another circuit design assisting apparatus.

Now, an exemplary operation of the circuit design assisting apparatus 2 of this embodiment is described with reference to FIG. 12. As shown, it is typically described that report information is generated based on layout information of a circuit automatically laid out based on a net list reconstructed in the first embodiment as described with reference to FIG. 8. When an operator operates the inputting device 210, the net list reading device 201 acquires net list information from the net list storage device 230 in step S1201. The net list reading device 201 then transmits the net list information to the terminal connection scanning device 205 in step S1201. The net list information in this embodiment is the same as the net list specifying the circuit as shown in FIG. 8.

When an operator operates the input device 210, the transition time period reading device 240 acquires transition time period information from the layout information storage device 240 and transmits the same to the input side processing device 206 in step S1202. As shown in to FIG. 13, transition time period information of a signal is stored linking with a terminal of the SRAM 300 receiving the signal. As mentioned earlier, the transition time period is calculated by the layout tool based on a connection with the terminal after the layout tool executes auto layout.

Further, when an operator operates the input device 210, the wiring capacity reading device 203 acquires wiring capacity information from the layout information storage device 240 and transmits the same to the output side processing device 2067in step S1203. As shown in FIG. 14, a capacity of a wiring is stored linking with the wiring defined by a terminal and a cell. For example, a wiring that connects the terminal DO0 to the low drive buffer U389 is represented by the description "DO0 U389" with an amount of 0.003 (pF). Similar to the transition time period information, the wiring capacity information is calculated by the layout tool based on a connecting condition with a terminal when the layout tool executes auto layout.

The cell library read device 204 acquires information of a cell library from the cell library storage device 250 and transmits the same to the output side processing device 207 when an operator operates the input device 210 in step S1204. As shown, the cell library information represents a discriminator of a cell and is stored linking with an input gate capacity of the cell. For example, a low drive buffer U389 is specified by a description "U389" while representing that a capacity of an input gate thereof amounts to 0.009 (pF). Such cell library information is used when the layout tool executes a layout.

Upon acquiring the information of the net list from the net list reading device 201, the terminal connection scanning device 205 designates a terminal, a layout result of which is inspected, in accordance with an operation of an operator though the input device 210. The terminal connection scanning device 205 detects a condition of connection with a terminal designated by the operator and generate scanning result information based thereupon in step S1206. The terminal connection scanning device 205 operates in the same manner as that 106 described in the first embodiment in step S1206, and transmits the scanning result information to all of the input side processing device and the output side processing device 206 and 207.

Upon acquiring the transition time period information and the scanning result information, the input side processing device 206 executes scanning (checking) a transition time period in step S1207.

Specifically, in the input side processing device 206, the transition time period scanning device 211 extracts a transition time period of a signal inputted to a terminal designated in the scanning result information from the transition time period information.

Then, the input/output processing device 206 inspects if the layout result satisfies a requirement by comparing the transition time period information extracted in step S1207 with the requirement to be met by the transition time period assigned to the designated terminal in step S1208. Specifically, the requirement inspection device 212 receives information of the transition time period extracted from the transition time period scanning device 211 and the requirement from the requirement reading device 209. The requirement inspection device 212 then compares the transition time period of the corresponding terminal with the requirement. The input side processing device 206 transmits a result of the inspection executed in the step S1208 to the report file construction device 208 in step S1209.

Upon receiving all of the wiring capacity information, the cell library information and the scanning result information, the output side processing device 207 executes scanning of the wiring capacity and the input gate capacity in step S1210. Specifically, in the output side processing device 207, the wiring capacity scanning device 221 extracts a capacity of wiring including a terminal designated in the scanning result information from the wiring capacity information. Further, the input gate capacity scanning device 222 extracts a capacity of an input gate of a cell connected a terminal designated in the scanning result information from the cell library information. When plural cells are connected to the designated cell, the input gate capacity scanning device 222 extracts capacities of input gates of the plural cells connected to one terminal from the cell library information, and transmits them to the input capacity totaling device 223. The input capacity totaling device 223 totalities the input gate capacities of the plural cells connected to the one terminal.

After completing the scanning of the wiring and input gate capacities, the output side processing device 207 totalities the extracted wiring and input gate capacities per terminal designated in the scanning result information in step S1211. Specifically, a capacity totaling device 224 in the output side processing device 207 acquires and totals the wring capacity information and the input gate capacity information transmitted from the wiring capacity scanning device 221 and the input gate capacity totaling device 223, respectively. For example, when the terminal DO0 of FIG. 8 is designated, the wiring capacity designated by "DO U389" as shown in FIG. 14 is extracted. An input gate capacity designated by U389 of FIG. 15 is extracted. The capacity totaling device 224 acquires and totalities these pieces of information. Thus, the capacity to be driven by the terminal DO0 can be calculated.

Then, the output side control device 207 inspects if the layout result satisfies the requirement by comparing the total capacities perterminal in step S1211 with a capacity as signed to each terminal in step S1212. Specifically, the requirement inspection device 225 acquires the information of the totaled result and the requirement from the capacity totaling device 224 and the requirement reading device 209, respectively, and compares with capacity and requirement of a corresponding terminal. The output side processing device 207 then transmits the result of the inspection executed in step S1212 to the report file construction device 208.

The report file construction device 208 generates a report file based on the inspection result received from the input side processing device 206 and the output side processing device 207 in step S1214. Specifically, as shown in FIG. 16, the report file includes identification information of a terminal specified in the scanning result information, information specifying an output terminal and an input terminal, and identification information of a cell connected to each terminal. Also included are information related to a transition time period of a signal inputted to each terminal of a hard macro, information of a capacity driven by a signal outputted from the hard macro, and information of inspection result as to if each terminal satisfies requirement. The information related to the transition time period includes all of a transition time period of a signal inputted to each terminal, a requirement value to be met by the transition time period, and information representing their units. Further, the information representing a capacity driven by a signal outputted from the hard macro includes a capacity to be driven by a signal outputted from each terminal, a requirement value to be met by a signal driving a capacity, and units of those.

Further, the terminal A0 serves as not only an output terminal of an integrated circuit, but also an input terminal to the hard macro. Since the transition time period of the signal inputted to the terminal A0 amounts to 0.315 (ps) and the requirement value amounts to 0.5 (ps), it is recognized that the requirement is satisfied. Further, the terminal DO0 serves as not only the input terminal of the integrated circuit, but also the output terminal of the hard macro. Since a capacity driven by a signal from the terminal DO0 amounts to 0.012 (pF) and a requirement value amounts to 0.15 (pF), it is recognized that the requirement is satisfied.

After generating the report file, the report file construction device 208 executes an output operation, such as displaying the report file on the display device 220, storing the report file in the report file storage device 260, etc. Thus, a user can readily confirm if a layout is executed and a designated terminal satisfies a requirement by either confirming the report file either displayed on the display device 220 or stored in the report file storage device 260.

As mentioned heretofore, according to the circuit design assisting apparatus of this embodiment, it can be readily confirmed if a layout is executed while a designated terminal satisfies the requirement.

Further as mentioned earlier, a terminal designated by an operator is only inspected using the input device 210 if it satisfies the requirement. However, only a terminal assigned an input or output signal requirement as acquired in the requirement reading device can be inspected. As a result, a labor of designating a terminal by the operator can be reduced, and a layout result can readily be inspected in relation to such a terminal.

Hence, both of the input and output side operation devices 206 and 208 operate and it is inspected if the signal requirement is satisfied not only by the transition time period of the signal inputted to the signal input terminal of the hard macro, but also by a capacity that a signal outputted from the terminal of the hard macro drives. However, only one of them can be executed. Further, the input side processing device 206 and the output side processing device 207 can be inspected by a different device.

According to the second embodiment, the layout tool executes the auto layout based on the net list created after the determination of the buffer addition/replacement as in the first embodiment. Thus, it is possible to inspect if the signal requirement in relation to the terminal of the hard macro included in the integrated circuit is met after insertion or replacement of the buffer as executed in the first embodiment. In addition, the inspection manner of the second embodiment can be applied to the original net list before the determination of buffer addition/replacement as in the first embodiment is executed. Then, the buffer addition/replacement operation of the first embodiment can be applied to a terminal determined as not satisfying the requirement in the report file as described with reference to FIG. 16. Thus, a buffer can be inserted only to a terminal necessitating the buffer while preventing needless insertion thereof to a terminal originally satisfying the requirement.

Further, when the buffer addition/replacement operation of the first embodiment is applied to a target terminal to meet a requirement, another terminal can dissatisfy a requirement assigned thereto as a result of the buffer addition/replacement to the target terminal and accordingly a change of layout. In such a situation, the buffer insertion/replacement operation of the first embodiment and the inspection operation of the layout of the second embodiment are repeated one after another, so that a net list satisfying the requirement assigned to all of the terminals can be generated.

Obviously, numerous additional modifications and variations of the present invention are possible in light of the above teachings. It is therefore to be understood that within the scope of the appended claims, the present invention may be practiced otherwise than as specifically described herein

What is claimed is:

1. A circuit design assisting apparatus for assisting a layout tool in designing an integrated circuit including a circuit module having at least two cells that achieve a prescribed function, said circuit design assisting apparatus comprising:
    a cell connection information acquiring device configured to acquire cell connection information, said cell connection information specifying connection counterparts to the at least two cells and used when automatic layout of the integrated circuit is executed by the layout tool;
    a terminal designating device configured to designate at least one terminal of the circuit module;
    a terminal connection information generation device configured to generate terminal connection information based on the cell connection information, said terminal connection information specifying connecting counterparts to the at least one designated terminal;
    a requirement acquiring device configured to acquire a requirement to be met by a signal either inputted to or outputted from the at least one designated terminal; and
    a buffer circuit determining device configured to determine if a buffer circuit is to be additionally connected between the at least one designated terminal and at least one of the connection counterparts and if a buffer circuit already connected to the at least one designated terminal is to be replaced by a different buffer circuit in accordance with the terminal connection information and the requirement.

2. The circuit design assisting apparatus as claimed in claim 1, further comprising an operation device configured to receive an input from an operator, wherein said terminal designation device designates the at least one terminal in accordance with the input.

3. The circuit design assisting apparatus as claimed in claim 1, wherein said terminal designation device designates the at least one terminal in accordance with the terminal connection information.

4. The circuit design assisting apparatus as claimed in claim 3, further comprising:
    a circuit chart display device configured to display a circuit chart in accordance with the terminal connection information, said circuit chart illustrating the at least one terminal linking with the requirement.

5. The circuit design assisting apparatus as claimed in claim 4, further comprising a wiring length requirement information generating device configured to generate wiring length requirement to be met by a wiring that connects to one of the buffer and the at least one terminal.

6. The circuit design assisting apparatus as claimed in claim 5, further comprising a cell connection information restructuring device configured to restructure the cell connection information reflecting the determination of addition or the replacement of the buffer.

7. The circuit design assisting apparatus as claimed in claim 6, further comprising:
    a restructured cell connection information acquiring device configured to acquire restructured cell connection information;
    a layout information acquiring device configured to acquire information of a layout executed in accordance with the restructured cell connection information;
    a requirement information acquiring device configured to acquire the requirement to be met by a signal either inputted to or outputted from the terminal;
    a signal intensity information acquiring device configured to acquire an intensity of a signal either inputted to of outputted from the terminal in accordance with the layout information; and
    a requirement determining device configured to determine and output a signal if the signal intensity meets the requirement by comparing the requirement information with the signal intensity.

8. The circuit design assisting apparatus as claimed in claim 7, wherein said signal intensity information acquiring device acquires a transition time of the signal inputted to the at least one terminal, and wherein said requirement information acquiring device acquires reference information to be compared with the transition time.

9. The circuit design assisting apparatus as claimed in claim 8, wherein said signal intensity information acquiring device acquires an electrostatic capacity to be driven by the signal outputted from the terminal, and wherein said requirement information acquiring device acquires a reference information to be compared with the electrostatic capacity.

10. A method of designing an integrated circuit including a circuit module having at least two cells exerting a prescribed function, said method comprising the steps of:
    acquiring cell connection information from a net list memory or from an input apparatus, the cell connection information specifying connection counterparts to terminals of the at least two cells;
    designating at least one of the terminals;
    generating terminal connection information based on the cell connection information, said terminal connection information specifying connection counterparts to the terminals;

acquiring a requirement to be met by a signal either inputted to or outputted from the designated terminals, the requirement being acquired from a requirement information memory or from an input apparatus;

determining if a buffer circuit is to be connected between at least one of the designated terminals and its counterpart and if a buffer circuit is to be replaced by a different buffer circuit in accordance with the terminal connection information and the requirement; and updating and storing the cell connection information in net list memory.

* * * * *